(12) United States Patent
Harima

(10) Patent No.: US 7,486,149 B2
(45) Date of Patent: Feb. 3, 2009

(54) METHOD OF MANUFACTURING SURFACE MOUNT TYPE CRYSTAL OSCILLATOR

(75) Inventor: Hidenori Harima, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 116 days.

(21) Appl. No.: 11/562,279

(22) Filed: Nov. 21, 2006

(65) Prior Publication Data

US 2007/0114884 A1 May 24, 2007

(30) Foreign Application Priority Data

Nov. 22, 2005 (JP) ............................... 2005-337602

(51) Int. Cl.
*H03B 1/00* (2006.01)
(52) U.S. Cl. ..................... 331/68; 331/158; 310/311; 257/679; 438/118
(58) Field of Classification Search ............... 331/68, 331/62, 116 R, 108 C, 108 D, 158; 310/311, 310/326, 327, 340, 344, 345, 348; 257/679, 257/685, 686, 687; 438/118, 121, 124, 125, 438/126
See application file for complete search history.

(56) References Cited

U.S. PATENT DOCUMENTS 6,833,768 B2 * 12/2004 Harima et al. ............... 331/158
2001/0020736 A1 * 9/2001 Nakazawa et al. ............ 257/678
2004/0036547 A1 * 2/2004 Harima ....................... 331/158
2004/0056729 A1 * 3/2004 Sakaba et al. ................ 331/158

FOREIGN PATENT DOCUMENTS

JP      2002198459 A   *  7/2002
JP      2005-6171 A       1/2005

* cited by examiner

*Primary Examiner*—Robert Pascal
*Assistant Examiner*—Ryan J Johnson
(74) *Attorney, Agent, or Firm*—Knobbe Martens Olson & Bear LLP

(57) ABSTRACT

A method of manufacturing a surface mount type crystal oscillator having a container body including a first recess and a second recess respectively formed in two main surfaces thereof, a crystal blank hermetically sealed in the first recess, an IC chip having an oscillation circuit integrated thereon and secured to the bottom surface of the second recess through thermo-compression bonding using bumps, and a protection resin for protecting a circuit-forming surface of the IC chip comprises the steps of applying a protection resin consisting of a flexible resin along the inner periphery of the second recess, and pressing the IC chip while the outer periphery of the IC chip is brought into contact with the applied protection resin to secure the IC chip to the bottom surface of the second recess.

5 Claims, 2 Drawing Sheets

METHOD OF MANUFACTURING SURFACE MOUNT TYPE CRYSTAL OSCILLATOR

BACKGROUND OF THE INVENTION

1. Field of the Invention

The present invention relates to a method of manufacturing a surface mount type quartz crystal oscillator which contains a quartz crystal element and an oscillation circuit using the crystal element within a surface mount package, and more particularly, to a method of forming a protective resin for an IC (integrated circuit) which has the oscillation circuit integrated therein.

2. Description of the Related Art

Surface mount type crystal oscillators are widely used as reference sources for frequency and time in compact portable electronic devices such as portable telephones, because of their small size and light weight. One of such surface mount type crystal oscillators comprises a container body which is formed with recesses in both main surfaces thereof to have an H-shaped cross section, a crystal blank hermetically sealed in one of the recesses, and an IC chip accommodated in the other recess. With an ever advancing reduction in size of portable electronic devices in recent years, further improvements have been also required for methods of manufacturing surface mount type crystal oscillators.

FIGS. 1A and 1B are a sectional view and a bottom view, respectively, of an example of a conventional surface mount type crystal oscillator. This surface mount type crystal oscillator generally comprises container body 1 having an H-shaped cross section as mentioned above, substantially rectangular crystal blank 2, and IC chip 3. Container body 1 is formed of laminated ceramics having center layer 1a and frame layers 1b, 1c. Center layer 1a is substantially rectangular in shape, while frame layers 1b, 1c are each in the shape of a frame which surrounds the outer periphery of center layer 1a, and are laminated on the top surface and bottom surface of center layer 1a, respectively. Center layer 1a and frame layer 1b form first recess 20a in which crystal blank 3, which functions as a crystal element, is hermetically sealed. Center layer 1a and frame layer 1c form second recess 20b in which IC chip 3 is accommodated. First recess 20a is formed with a pair of crystal holding terminals 4 on the bottom surface thereof for retaining crystal blank 2. Each short side of frame layer 1c is caved in an arcuate shape in a portion opposite to second recess 20b to define space 9 therein.

Crystal blank 2 is, for example, a substantially rectangular AT-cut quartz crystal blank which is provided with excitation electrodes (not shown) on both main surfaces thereof, and lead-out electrodes are extended from these excitation electrodes toward opposite sides of an end of crystal blank 2. Both opposite sides of the end of crystal blank 2, to which the lead-out electrodes are extended, are secured on crystal holding terminals by conductive adhesive 5 or the like, thereby electrically and mechanically connecting crystal blank 2 to crystal holding terminals 4 within first recess 20a. A metal ring, not shown, and the like are disposed on the top surface of frame layer 1b which defines first recess 20a, and metal cover 6 is bonded to this metal ring by seam welding or the like. In this way, crystal blank 2 is hermetically sealed in first recess 20a.

IC chip 3 is substantially rectangular in shape. In IC chip 3, an oscillation circuit which uses crystal blank 2, a temperature compensation mechanism for compensating the frequency-temperature characteristics of crystal blank 2, and the like are integrated on a semiconductor substrate. The oscillation circuit and temperature compensation mechanism are formed on one main surface of the semiconductor substrate through a general semiconductor device fabrication process. Therefore, a circuit-forming surface refers to one of both main surfaces of IC chip 3, on which the oscillation circuit and temperature compensation mechanism are formed on the surface of the semiconductor substrate. The circuit-forming surface is also formed with a plurality of IC terminals for connecting IC chip 3 to an external circuit. These IC terminals include a power supply terminal, a ground terminal, an oscillation output terminal, a pair of connection terminals for connecting to crystal blank 2, an AFC terminal for receiving an automatic frequency control (AFC) signal, and the like. Then, the IC terminals are bonded to circuit terminals provided on the bottom surface of second recess 20b through ultrasonic thermo-compression bonding using bumps 7, thereby securing IC chip 3 within second recess 20b. Crystal blank 2 is electrically connected to the oscillation circuit within IC chip 2 through crystal holding terminals 4, conductive paths formed in container body 1, circuit terminals, and IC terminals. Mounting electrodes 8 are formed at four corners on the outer bottom surface of container body 1, i.e., at four corners on the bottom surface of frame layer 1c for use in surface-mounting IC chip 3 on a wiring board, where the power supply, output, automatic frequency control (AFC), and ground terminals of the IC terminals are electrically connected to associated mounting electrodes 8, respectively, through conductive paths, not shown, routed in container body 1.

For manufacturing the crystal oscillator as described above, after IC chip 3 has been secured on the bottom surface of second recess 20b, injection needles 10 are inserted into arcuate spaces 9 formed in both short sides of frame layer 1c, such that a liquid protection resin 11 is injected through needles 10 for protecting IC chip 3, as described in Japanese Patent Laid-open Application No. 2005-6171 (JP, A, 2005-006171). In this way, a so-called under-fill is formed for IC chip 3 to protect the circuit-forming surface of IC chip 3.

It should be noted that as the crystal oscillator is increasingly reduced in size, a narrower spacing is ensured between IC chip 3 and frame layer 1c, so that needles 10 cannot be inserted for injecting a resin unless spaces 9 are formed in frame layer 1c as mentioned above. If protection resin 11 were injected without inserting needles 10 into spaces 9, protection resin 11 would spread over the bottom surface of IC chip 3, surface of frame layer 1c, and surfaces of mounting electrodes 8, causing the crystal oscillator to fail to satisfy criteria related to its appearance. Particularly, when protection resin 11 sticks to mounting electrodes 8, a problem will arise when IC chip 3 is surface-mounted on a wiring board. Accordingly, frame layer 1c must be formed with arcuate spaces 9 for injecting the resin.

However, in the conventional surface mount type crystal oscillator described above, spaces 9 for injecting the resin must be formed in frame layer 1c which defines second recess 20a for accommodating IC chip 3, but the formation of spaces 9 constitutes a cause of impediment to a further reduction in size of the crystal oscillator. Specifically, since spaces 9 for injecting the resin are formed, frame layer 1c must be previously designed to have the short sides with a large width, i.e., a distance between the recessed surface and outer surface, in order to ensure a sufficient strength, so that the conventional crystal oscillator is disadvantageous in that container body 1 is correspondingly increased in size when it accommodates IC chip 3 of the same size.

SUMMARY OF THE INVENTION

It is an object of the present invention to provide a method of manufacturing a surface mount type crystal oscillator, which is capable of appropriately protecting an IC chip and readily accomplishing a reduction in size of the crystal oscillator.

The object of the present invention is achieved by a method of manufacturing a surface mount type crystal oscillator which has a container body including a first recess and a second recess respectively formed in two main surfaces thereof, a crystal blank hermetically sealed in the first recess, an IC chip having an oscillation circuit integrated thereon and secured to the bottom surface of the second recess through thermo-compression bonding using bumps, and a protection resin for protecting a circuit-forming surface of the IC chip. The method includes the steps of applying a protection resin consisting of a flexible resin along the inner periphery of the second recess, and pressing the IC chip while the outer periphery of the IC chip is brought into contact with the applied protection resin to secure the IC chip to the bottom surface of the second recess.

According to the present invention, since the outer periphery of the IC chip is pressed against and closely contacted to the flexible resin applied along the inner periphery of the second recess, the outer periphery of the IC chip is sealed by the flexible resin. Consequently, the circuit-forming surface of the IC chip is isolated from the outside and protected. In this event, arcuate spaces need not be formed in the inner sides of the short sides of a frame layer which forms part of the second recess in order to previously apply the flexible resin along the inner periphery of the second recess.

DETAILED DESCRIPTION OF THE PREFERRED EMBODIMENTS

Figure 1A:
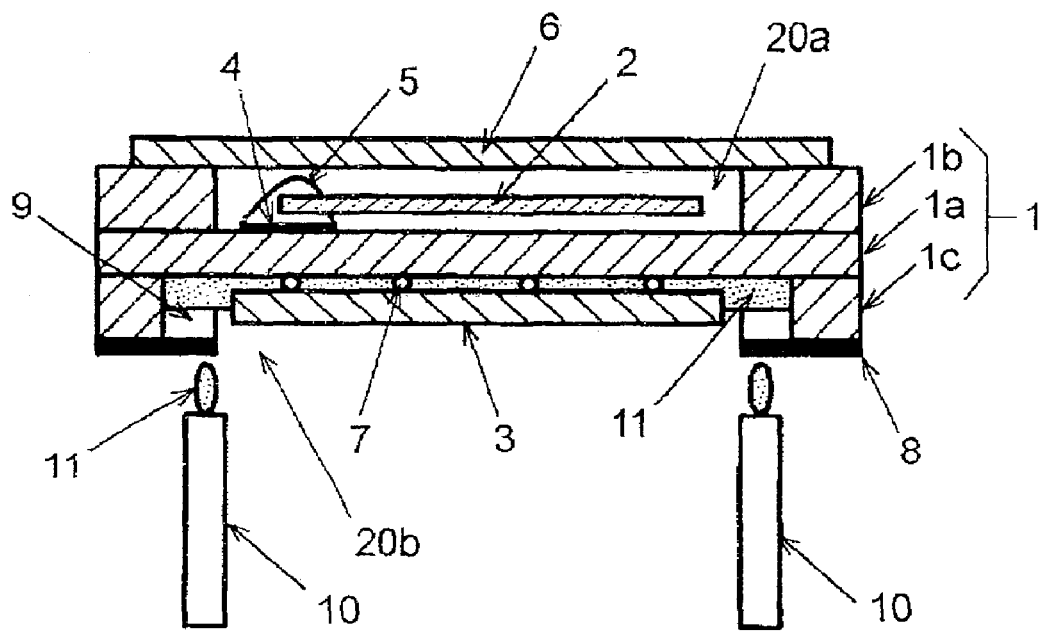
FIG. 1A is a sectional view illustrating an example of a conventional surface mount type crystal oscillator.
Figure 1B:
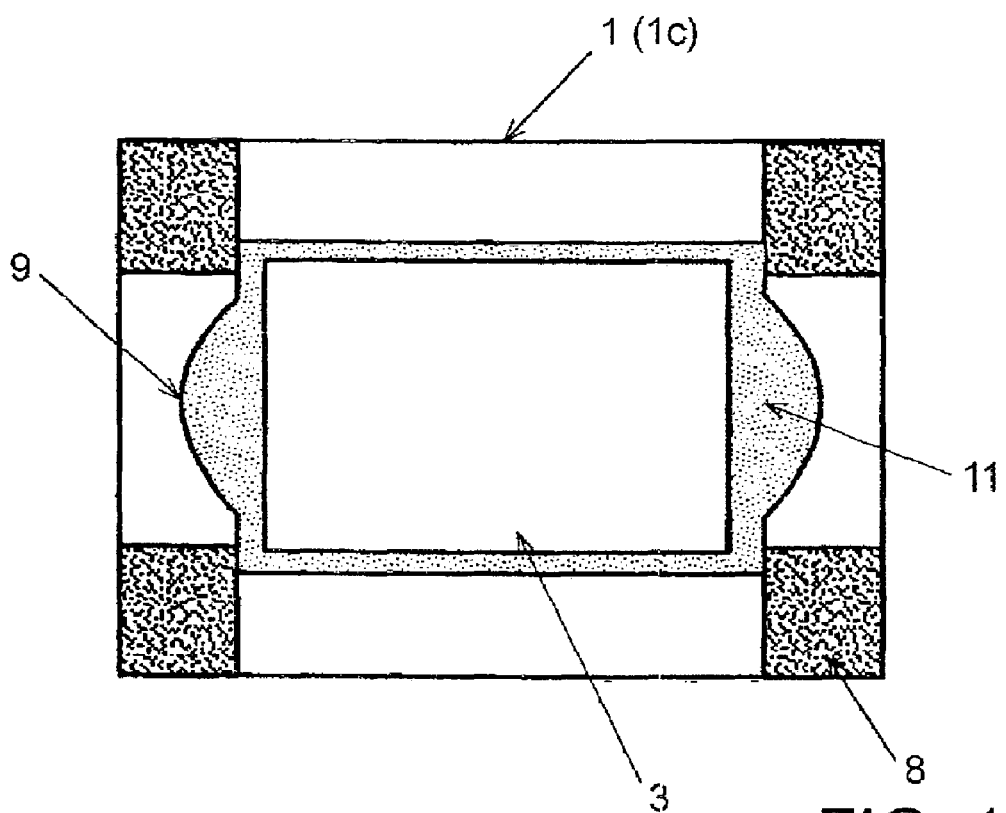
FIG. 1B is a bottom view of the surface mount type crystal oscillator illustrated in FIG. 1A.
Figure 2A:
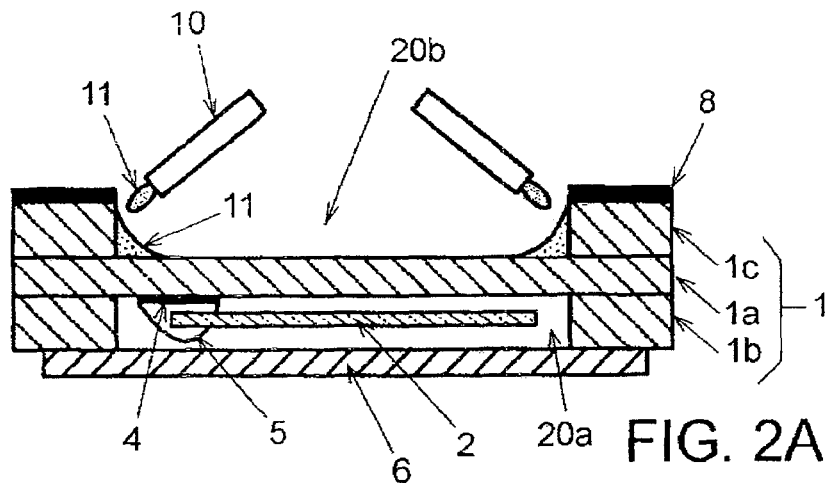
FIGS. 2A and 2B are sectional views each illustrating a process of manufacturing the surface mount type crystal oscillator in one embodiment of the present invention.
Figure 2B:
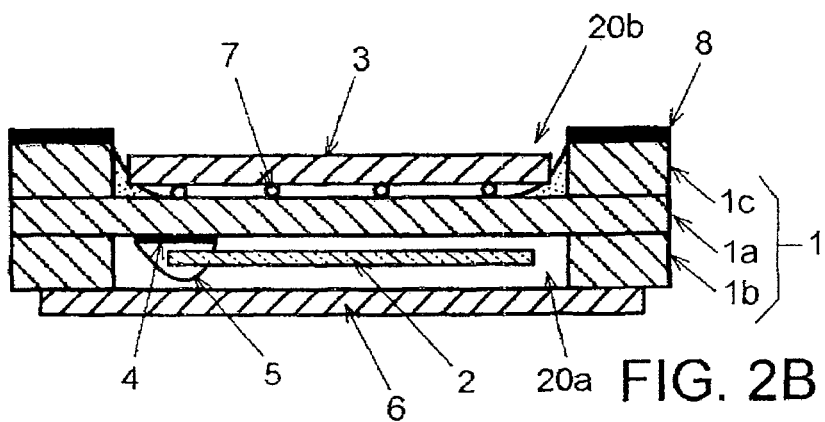
Figure 2C:
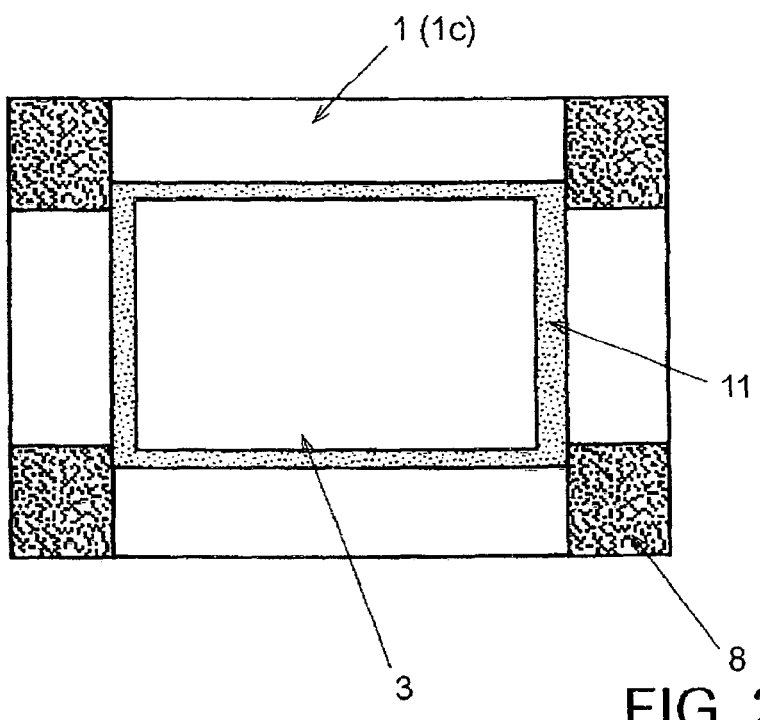
FIG. 2C is a bottom view of the manufactured surface mount type crystal oscillator.

A method of manufacturing a surface mount type crystal oscillator according to one embodiment of the present invention will be described with reference to FIGS. 2A to 2C. In FIGS. 2A to 2C, components identical to those in FIGS. 1A and 1B are designated the same reference numerals, and the same description is not repeated. It should be noted, however, that for purposes of description, sectional views illustrated in FIGS. 2A and 2B are drawn upside down with respect to the sectional view of FIG. 1A.

Like the conventional crystal oscillator illustrated in FIGS. 1A and 1B, the surface mount type crystal oscillator of this embodiment comprises container body 1 having an H-shaped cross section with first and second recesses 20a, 20b formed in two main surfaces, respectively, crystal blank 2, and IC chip 3. Container body 1 is formed of laminated ceramics having center layer 1a and frame layers 1b, 1c. Crystal blank 2 is secured to crystal holding terminals 4 disposed on the bottom surface of first recess 20a with conductive adhesive 5, and then is hermetically sealed in first recess 20a. IC chip 3 is secured to the bottom surface of second recess 20b through thermo-compression bonding using bumps, such that its circuit-forming surface opposes the bottom surface of second recess 20b.

A description will be given of processes of manufacturing the crystal oscillator as described above.

First, after hermetically sealing crystal blank 2 in first recess 20a of container body 1, container body 1 is turned upside down such that the bottom surface of second recess 20b faces upward. Then, as illustrated in FIG. 2A, needle 10 is brought close to the inner periphery of second recess 20b, i.e., four sides of the bottom surface of second recess 20b defined substantially in a rectangular shape, to apply protection resin 11 along the inner periphery of second recess 20b. Assume that protection resin 11 used herein is flexible, i.e. elastic, after the curing. Such a resin may be, for example, a silicone resin. Assume herein that thermosetting silicone resin is used for protection resin 11.

Next, bumps 7 have been previously disposed on IC terminals of IC chip 3, and the outer periphery of IC chip 3 is brought into contact with and kept in close contact with protection resin (i.e., flexible resin) 11 such that the circuit-forming surface opposes the bottom surface of second recess 20b. In this event, flexible resin 11 remains in an uncured state, and bumps 7 on the IC terminals are positioned on the circuit terminals, not shown, formed on the bottom surface of second recess 20b.

Next, bumps 7 on IC chip 3 are mechanically and electrically bonded to the circuit terminals on the bottom surface of second recess 20b through ultrasonic thermo-compression bonding, thereby securing the circuit-forming surface of IC chip 3 to the bottom surface of second recess 20b. In this event, flexible resin 11 is also pressed to bring IC chip 3 in closer contact with flexible resin 11. Finally, flexible resin 11 is thermally cured.

In the manufacturing method described above, since IC chip 3 is secured to the bottom surface of second recess 20b while the outer periphery of IC chip 3 is pressed against flexible resin 11, the outer periphery of IC chip 3 is sealed by flexible resin 11. In this way, the circuit-forming surface of IC chip 3 is isolated from the outside, and is protected from dust and the like which would otherwise introduce thereinto.

In this manufacturing method, flexible resin 11 is simply applied along the inner periphery of second recess 20b beforehand, without the need for previously forming arcuate spaces 9 in frame layer 1c of container body 1.

In the present invention, the flexible resin used as protection resin 11 is not limited to the thermosetting silicone resin. An arbitrary protection resin can be used as long as it is elastic after curing and can seal the outer periphery of IC chip 3 to prevent dust and the like from introducing thereinto. Such protection resins include a ultraviolet-setting or a cold setting silicone resin, a urethane resin and the like.

In the foregoing description, protection resin 11 is cured after IC chip 3 has been secured to the bottom surface of second recess 20b. However, when protection resin 11 is sufficiently elastic (flexible) even after it is cured, IC chip 3 may be secured after protection resin 11 has been cured.

The present invention can also be applied to a container body which is not originally formed with a first and a second recess. For example, the present invention can also be applied in a similar manner when a mounting substrate having a recess, in which an IC chip is placed, is bonded to the bottom surface of a crystal unit having a crystal blank hermetically sealed therein to create a crystal oscillator. In this event, the mounting substrate may be such that its recess opening side is bonded to the bottom surface of the crystal unit, or its closed surface is bonded to the bottom surface of the crystal unit.

What is claimed is:

1. A method of manufacturing a surface mount type crystal oscillator having a container body including a first recess and a second recess respectively formed in two main surfaces thereof, a crystal blank hermetically sealed in the first recess, an IC chip having an oscillation circuit integrated thereon and secured to a bottom surface of the second recess through thermo-compression bonding using bumps, and a protection resin for protecting a circuit-forming surface of said IC chip, said method comprising the steps of:

applying the protection resin consisting of a flexible resin along an inner periphery of the second recess said flexible resin comprises a silicone resin which is a thermo-setting silicone resin;

pressing said IC chip while an outer periphery of said IC chip is brought into contact with the applied protection resin to secure said IC chip to the bottom surface of the second recess; and thermally curing the silicone resin after said IC chip has been secured to the bottom surface of the second recess.

2. The manufacturing method according to claim 1, wherein said IC chip is secured to the bottom of the second recess through ultrasonic thermo-compression bonding.

3. A method of manufacturing a surface mount type crystal oscillator, comprising the steps of:

providing a container body including a first recess and a second recess respectively formed in two main surfaces thereof;

sealing a crystal blank hermetically in the first recess;

applying a flexible resin exclusively along a bottom inner periphery of the second recess;

securing to a bottom surface of the second recess an IC chip having an oscillation circuit integrated on its circuit-forming surface via bumps formed on the circuit-forming surface while pressing the IC chip against the flexible resin to seal the outer periphery of the IC chip by the flexible resin; and curing the flexible resin after the IC chip is pressed against the flexible resin.

4. The manufacturing method according to claim 2, wherein the IC chip is secured to the bottom surface of the second recess by ultrasonic thermo-compression bonding.

5. The manufacturing method according to claim 3, wherein the flexible resin is cured thermally.

* * * * *

UNITED STATES PATENT AND TRADEMARK OFFICE
CERTIFICATE OF CORRECTION

PATENT NO. : 7,486,149 B2
APPLICATION NO. : 11/562279
DATED : February 3, 2009
INVENTOR(S) : Hidenori Harima Page 1 of 1

It is certified that error appears in the above-identified patent and that said Letters Patent is hereby corrected as shown below:

Column 6, line 20; In Claim 4, change "claim 2," to --claim 3,--.

Signed and Sealed this

Thirteenth Day of October, 2009

David J. Kappos
*Director of the United States Patent and Trademark Office*